United States Patent
Kinsley

(10) Patent No.: US 9,827,629 B2
(45) Date of Patent: Nov. 28, 2017

(54) CONNECTION VERIFICATION TECHNIQUE

(71) Applicant: Micron Technology, Inc., Boise, ID (US)

(72) Inventor: Thomas Kinsley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 775 days.

(21) Appl. No.: 14/073,607

(22) Filed: Nov. 6, 2013

(65) Prior Publication Data

US 2014/0061285 A1 Mar. 6, 2014

Related U.S. Application Data

(62) Division of application No. 12/938,208, filed on Nov. 2, 2010, now Pat. No. 8,590,146, which is a division
(Continued)

(51) Int. Cl.
| | |
|---|---|
| *H05K 3/34* | (2006.01) |
| *B23K 1/00* | (2006.01) |
| *G01R 31/04* | (2006.01) |
| *H05K 1/02* | (2006.01) |
| *H05K 1/11* | (2006.01) |

(52) U.S. Cl.
CPC .......... *B23K 1/0016* (2013.01); *G01R 31/048* (2013.01); *H05K 1/0268* (2013.01); *H05K 1/111* (2013.01); *H05K 3/3436* (2013.01); *H05K 2201/09663* (2013.01); *H05K 2201/09809* (2013.01); *H05K 2201/10734* (2013.01); *H05K 2203/163* (2013.01); *H05K 2203/175* (2013.01); *Y02P 70/611* (2015.11); *Y10T 29/49004* (2015.01); *Y10T 29/4913* (2015.01); *Y10T 29/49128* (2015.01); *Y10T 29/49144* (2015.01)

(58) Field of Classification Search
CPC ....... G11B 5/295; G11B 5/4853; G11B 5/486; Y10T 29/49025; Y10T 29/49027; Y10T 29/49032; Y10T 29/49041
USPC ............... 29/603.03, 603.04, 603.09, 603.12
See application file for complete search history.

(56) References Cited

U.S. PATENT DOCUMENTS

| | | | |
|---|---|---|---|
| 4,982,892 A | | 1/1991 | Parla et al. |
| 5,084,691 A | * | 1/1992 | Lester .................... H01H 61/00 337/166 |

(Continued)

FOREIGN PATENT DOCUMENTS

| | | |
|---|---|---|
| EP | 0852354 | 7/1998 |
| GB | 2278965 | 12/1994 |

(Continued)

*Primary Examiner* — Paul D Kim
(74) *Attorney, Agent, or Firm* — Fletcher Yoder, P.C.

(57) ABSTRACT

Some embodiments of the present invention are generally directed to testing connections of a memory device to a circuit board or other device. In one embodiment, a memory device that is configured to facilitate continuity testing between the device and a printed circuit board or other device is disclosed. The memory device includes a substrate and two connection pads that are electrically coupled to one another via a test path. A system and method for testing the connections between a memory device and a circuit board or other device are also disclosed, as are additional techniques for detecting excess temperature and enabling special functionalities using multi-stage connection pads.

19 Claims, 4 Drawing Sheets

Related U.S. Application Data of application No. 11/323,757, filed on Dec. 30, 2005, now Pat. No. 7,835,158.

(56) References Cited

U.S. PATENT DOCUMENTS

| | | | |
|---|---|---|---|
| 5,198,756 A | 3/1993 | Jenkins et al. | |
| 5,637,835 A | 6/1997 | Matern | |
| 5,783,870 A * | 7/1998 | Mostafazadeh | H01L 25/105 257/686 |
| 5,929,521 A * | 7/1999 | Wark | G01R 1/06738 257/692 |
| 6,084,780 A | 7/2000 | Happoya | |
| 6,381,141 B2 | 4/2002 | Corisis et al. | |
| 6,879,465 B2 * | 4/2005 | Tsuchiya | G11B 5/484 174/260 |
| 7,276,802 B2 * | 10/2007 | Hall | H01L 21/563 257/734 |
| 7,279,797 B2 * | 10/2007 | Corisis | H01L 23/4985 257/777 |
| 7,312,534 B2 | 12/2007 | Delos Santos et al. | |
| 7,619,856 B2 * | 11/2009 | Matsumoto | G11B 5/4826 29/603.06 |
| 2002/0043986 A1 | 4/2002 | Tay et al. | |
| 2002/0180026 A1 | 12/2002 | Liu et al. | |
| 2003/0197281 A1 | 10/2003 | Farnworth et al. | |
| 2003/0214558 A1 | 11/2003 | Kim et al. | |

FOREIGN PATENT DOCUMENTS

| | | |
|---|---|---|
| GB | 2311618 | 10/1997 |
| JP | 3428472 | 5/2003 |

* cited by examiner

CONNECTION VERIFICATION TECHNIQUE

CROSS-REFERENCE TO RELATED APPLICATIONS

This application is a divisional of U.S. patent application Ser. No. 12/938,208, filed on Nov. 2, 2010, now U.S. Pat. No. 8,590,146 which is a divisional of U.S. patent application Ser. No. 11/323,757, filed on Dec. 30, 2005, and issued as U.S. Pat. No. 7,835,158 on Nov. 16, 2010.

BACKGROUND OF THE INVENTION

Field of the Invention

The present invention relates generally to electronic devices, such as memory devices. More particularly, the present invention relates to a device and method for efficiently testing interconnections of electronic devices.

Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled circuits are used in a wide variety of applications. Such applications include personal computers, control systems, telephone networks, and a host of other consumer products. A personal computer or control system includes various components, such as microprocessors, that handle different functions for the system. By combining these components, various consumer products and systems may be designed to meet specific needs. Microprocessors are essentially generic devices that perform specific functions under the control of software programs. These software programs are generally stored in one or more memory devices that are coupled to the microprocessor or other peripherals.

Semiconductor memory devices, such as dynamic random access memory (DRAM) devices, are widely used for storing data in systems such as computer systems. These memory devices are generally coupled to a substrate, such as a printed circuit board (PCB), by employing a surface mounting technique (SMT). Fine pitch surface mount (FPT), pin grid array (PGA), and ball grid array (BGA) are examples of leading surface mount technologies. As will be appreciated, BGA technology offers several advantages over FPT and PGA. Among the most often cited advantages of BGA are reduced co-planarity problems, since there are no leads; reduced placement problems; reduced paste printing problems; reduced handling damage; smaller size; better electrical and thermal performance; better package yield; better board assembly yield; higher interconnect density; multi-layer interconnect options; higher number of inputs and outputs for a given footprint; easier extension to multi-chip modules; and faster design-to-production cycle time.

A BGA semiconductor package generally includes a semiconductor chip mounted to a substrate. The semiconductor chip may be electrically coupled to the substrate by bond wires. The substrate contains conductive routing which allows the signals to pass from the semiconductor chip on the substrate, through the substrate, and to connection pads on a lower portion of the substrate. A plurality of solder balls are deposited and electrically coupled to the connection pads on the backside of the substrate to be used as input/output terminals for electrically connecting the substrate to a PCB or other external device. Once the BGA package is secured to a PCB or other device, however, the package itself obscures the connections between the package and the PCB or device, which increases the difficulty associated with identifying soldering faults, such as electrical shorts and opens, and generally verifying that the package is properly connected.

While various x-ray machines and special microscopes have been developed in an attempt to overcome some of these difficulties, it will be appreciated that these solutions are incomplete and expensive to implement. Additionally, boundary scans, such as the JTAG standard published by IEEE, allow some connections of a memory device to be tested. However, JTAG requires extra device interconnections, adds die size, is time consuming, and may impact loading to higher speed I/O. Further, JTAG does not support testing of certain connections, such as power and ground connections.

There is a need, therefore, for devices and methods that facilitate efficient testing of all interconnections between connection pads of two substrates, such as a substrate of an integrated circuit (I/C) device and a PCB. There is a further need for devices and methods that enable such testing without increasing the die size or affecting the operation of the I/C devices.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

Certain embodiments of the present invention are generally related to testing the interconnections between an I/C device and a mounting surface. In some embodiments, a connection pad of a memory device is electrically coupled via a test path to at least one other connection pad of the device to establish a temporary current path to facilitate testing. In other embodiments, a connection pad of a printed circuit board is similarly coupled to at least one other connection pad of the circuit board. As discussed below, a continuity test may then be performed to verify proper connections at these connection pads. Once continuity testing is complete, the test path between connection pads may be disabled to avoid interfering with operation of the memory device. In some embodiments, the presently disclosed techniques allow for efficient verification of the connectivity of all device interconnections to a printed circuit board when mounted to a surface of the circuit board. Some other embodiments include enabling special functionalities and detecting excess temperatures using multi-stage connection pads.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
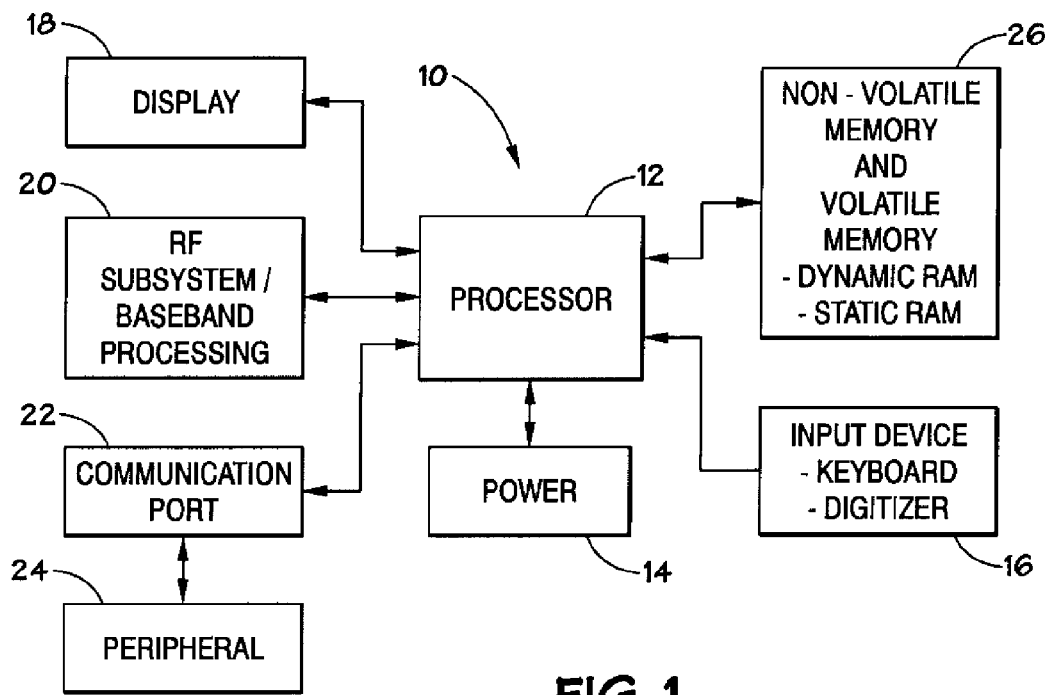
FIG. 1 illustrates a block diagram of an exemplary processor-based device in accordance with embodiments of the present invention.

Turning now to the drawings, FIG. 1 is a block diagram of an electronic system containing integrated circuit devices that may employ embodiments of the present invention. The electronic device or system, which is generally referred to by the reference numeral 10, may be any of a variety of types such as a computer, pager, cellular phone, personal organizer, or the like. In a typical processor-based device, a processor 12, such as a microprocessor, controls the operation of system functions and requests.

The system 10 may include a power supply 14, which may comprise a battery or batteries, an AC power adapter, or a DC power adapter, for instance. Various other devices may be coupled to the processor 12 depending on the functions that the system 10 performs. For example, an input device 16 may be coupled to the processor 12 to receive input from a user. The input device 16 may comprise a user interface and may include buttons, switches, a keyboard, a light pen, a mouse, a digitizer, a voice recognition system, or any of a number of other input devices. An audio or video display 18 may also be coupled to the processor 12 to provide information to the user. The display 18 may include an LCD display, a CRT, LEDs, or an audio display, for example.

An RF sub-system/baseband processor 20 may be coupled to the processor 12 to provide wireless communication capability. The RF subsystem/baseband processor 20 may include an antenna that is coupled to an RF receiver and to an RF transmitter (not shown). Furthermore, a communications port 22 may be adapted to provide a communication interface between the electronic system 10 and a peripheral device 24. The peripheral device 24 may include a docking station, expansion bay, or other external component.

The processor 12 may be coupled to various types of memory devices to facilitate its operation. For example, the processor 12 may be connected to memory 26, which may include volatile memory, non-volatile memory, or both. The volatile memory of memory 26 may comprise a variety of memory types, such as static random access memory ("SRAM"), dynamic random access memory ("DRAM"), first, second, or third generation Double Data Rate memory ("DDR1", "DDR2", or "DDR3", respectively), or the like. The non-volatile memory may comprise various types of memory such as electrically programmable read only memory ("EPROM") or flash memory, for example. Additionally, the non-volatile memory may include a high-capacity memory such as a tape or disk drive memory. The processor 12 and the memory 26 may employ one or more integrated circuit components. Also, the processor 12 and the memory 26 are examples of integrated circuit components that may include sense amplifier circuits constructed in accordance with embodiments of the present invention.

Figure 2:
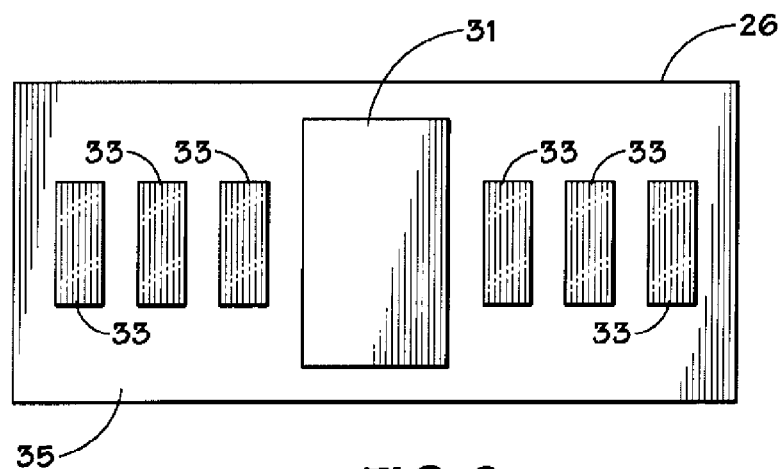
FIG. 2 illustrates an exemplary memory array.

In some embodiments, memory 26 may include a multi-chip memory array, as illustrated in FIG. 2. In this arrangement, a memory controller 31 is coupled to a plurality of memory devices 33. The memory controller 31 and the memory devices 33 are surface mounted in a planar fashion on the same substrate 35, such as a printed circuit board. As noted below, the memory devices 33 and the substrate 35 may include various connection pads and test paths to allow efficient testing of the interconnection of the devices 33 to the substrate 35 in accordance with the present techniques.

Figure 3:
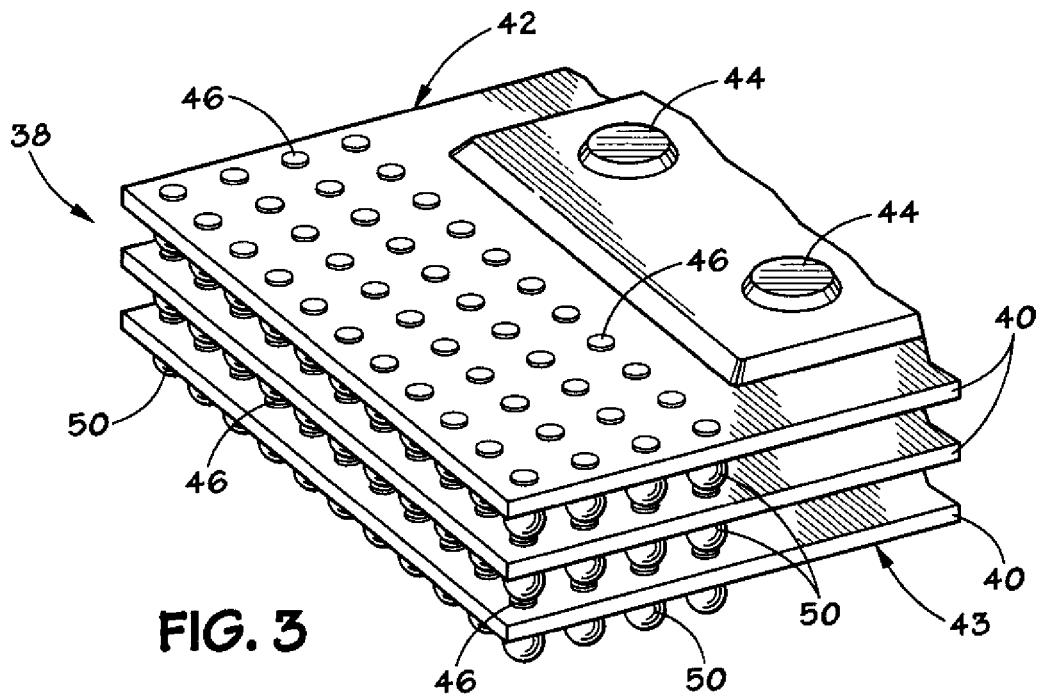
FIG. 3 is a partial perspective view of an exemplary memory device having multi-stage connection pads in accordance with one embodiment of the present invention.
Figure 4:
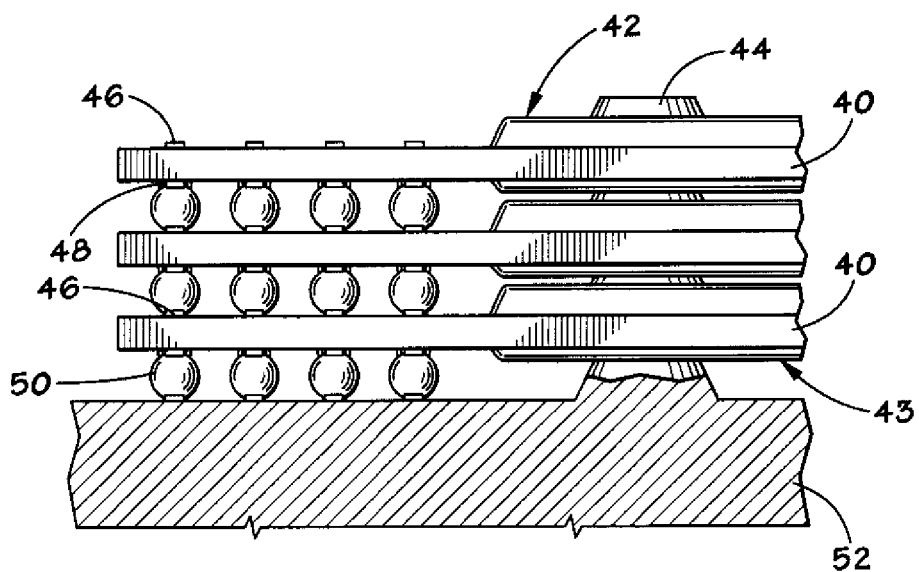
FIG. 4 is a partial elevational view of the memory device of FIG. 3.

While the present techniques may be widely applicable to a number of various electronic devices, the presently disclosed techniques find particular application with respect to a memory device 38, such as the ball grid array (BGA) illustrated in FIGS. 3 and 4. While the presently illustrated BGA package is a stacked ball grid array (SBGA), it should be noted that other embodiments may use other BGA technologies, including non-stacked arrays and fine-pitch ball grid arrays (FBGA), in full accordance with the present techniques. Indeed, though reference is made to an exemplary memory device 38, it will be appreciated that the present techniques may also be advantageously employed in connection with other, non-BGA memory devices, as well as other electronic devices.

In the presently illustrated embodiment, the memory device 38 includes a plurality of substrates 40 that may be stacked on top of each other. Each exemplary substrate 40 includes a die side 42 and a ball side 43. As will be appreciated, one or more chips or dies (not shown), such as memory chips or microprocessor chips, for example, may be mounted to the die side 42 of the substrate 40. It will be further appreciated that such chips may be fully encapsulated, partially encapsulated, or bare, depending upon the specific application intended for the memory device 38. In certain embodiments, the die side 42 may also contain alignment features 44 to facilitate stacking and assembly of the memory device 38.

The ball sides 43 of the substrates 40 include solder balls 50. As may be appreciated, the solder balls 50 are electrically coupled to the chip through vias or traces (not illustrated) of each substrate 40. The solder balls 50 may be used for adhesion, as well as electrical conductivity. Solder balls 50 may also facilitate coupling of the memory device 38 to connection pads of a substrate, such as a printed circuit board (PCB) 52, as illustrated in FIG. 4. As will be appreciated, such coupling allows electrical communication between the memory device 38 and the PCB 52 or other external circuitry. The solder balls 50 are generally positioned between lower connection pads 46 and upper connection pads 48 of the substrates 40 and PCB 52.

As discussed below, in certain embodiments, some or all of the lower connection pads 46, the upper connection pads 48, or some combination thereof, may include multi-stage connection pads having multiple conductive pads. In a subset of such embodiments, the multi-stage connection pads may be configured to include an inner conductive pad and an outer conductive pad positioned about some of or the entire inner conductive pad, such that the inner and outer conductive pads are electrically isolated from one another. As discussed in greater detail below, solder balls may be coupled to the inner conductive pads and a test path may be provided between a pair of outer conductive pads. When the solder balls adjacent the connection pads are heated, these solder balls may deform and make electrical contact with the outer conductive pad in addition to the inner conductive pad. In such a case, an electrical pathway is thus established from one solder ball to another via the outer conductive pads and the test path. As discussed below, a continuity test may then be employed to verify proper upper and lower connections of the solder balls to respective surfaces. As will be appreciated, given proper alignment before heating, the continuity of the path from one solder ball to another via the outer conductive pads will be generally indicative of an adequate electrical connection of the solder balls to the inner conductive pads.

Figure 5:
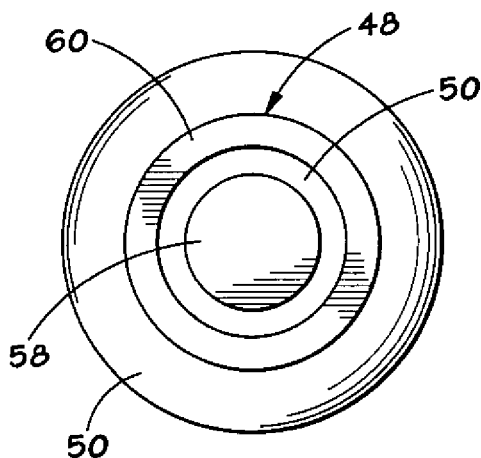
FIG. 5 is a top plan view of an exemplary multi-stage connection pad and solder ball of a memory device or printed circuit board in accordance with certain embodiments of the present invention.
Figure 6:
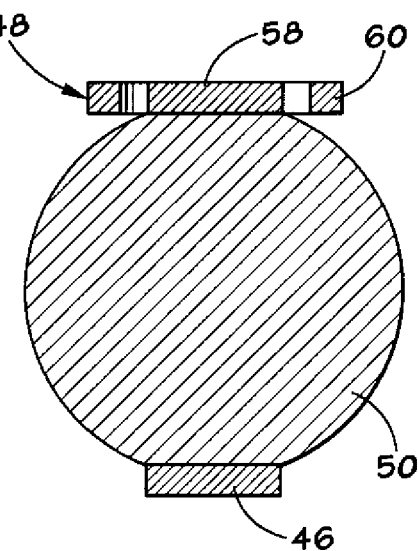
FIG. 6 is an elevational view of connection pads and a solder ball of an exemplary system prior to processing the system in a reflow oven in accordance with one embodiment of the present invention.
Figure 7:
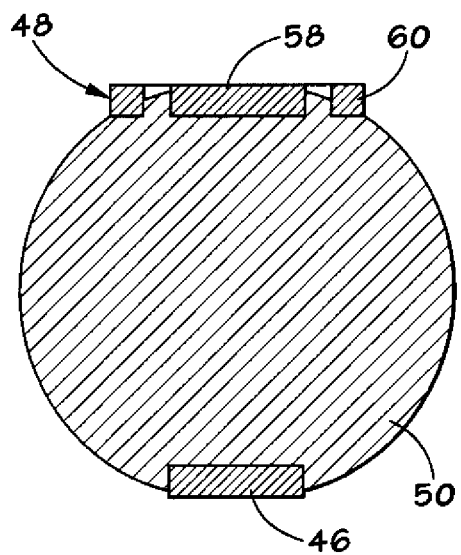
FIG. 7 is an elevation view of the connection pads and solder ball of FIG. 6 following processing of these components in a reflow oven in accordance with one embodiment of the present invention.

Certain additional details may be better understood through the present discussion and with reference to FIGS. 5-7. FIG. 5 is a top plan view of one solder ball 50 and an upper connection pad 48. In the present embodiment, upper connection pad 48 is a multi-stage connection pad that includes a plurality of conductive connection pads, such as an inner or primary conductive pad 58 and an outer or target conductive pad 60. For the sake of clarity, upper connection pad 48 is illustrated independent of an associated substrate 40.

In order to couple the memory device 38 to a printed circuit board 52, such as in the arrangement provided in FIG. 3, the solder balls 50 are aligned between lower connection pads 46 on the circuit board 52 and upper connection pads 48 located on the underside of a substrate 40, as illustrated in FIG. 6. In the present embodiment, the inner and outer conductive pads 58 and 60 of upper connection pad 48 are substantially concentric. However, other geometric designs are also envisaged in accordance with the present techniques.

When first aligned, a solder ball 50 may contact a lower connection pad 46 and the inner conductive pad 58 of a corresponding upper connection pad 48, without contacting the outer conductive pad 60, such as provided in the illustration of FIG. 6. In order to securely couple the memory device 38 to the PCB 52, the assembly may be heated in a number of manners, such as processing the assembly through a reflow oven. Sufficient heat will cause the solder balls 50 to begin melting, thereby securing the memory device 38 to the PCB 52 via the solder balls 50. As will be appreciated, a high temperature solder paste may be applied to the connection pads 46 of the PCB 52 to prevent misalignment of memory device 38 with respect to the PCB 52 prior to the heating process. As the solder balls 50 melt, the solder balls deform and make contact with outer conductive pad 60 of the upper connection pad 48, as illustrated in FIG. 7.

Figure 8:
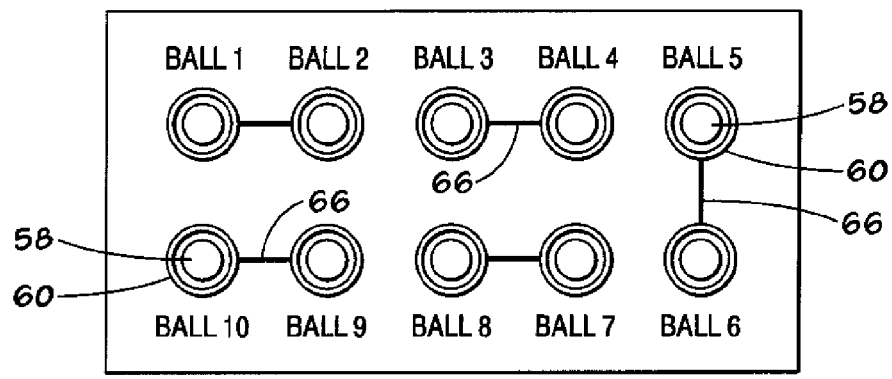
FIG. 8 is a plan view of a plurality of connection pads and illustrates an exemplary configuration for electrically interconnecting the connection pads to facilitate continuity testing in accordance with exemplary embodiments of the present invention.
Figure 9:
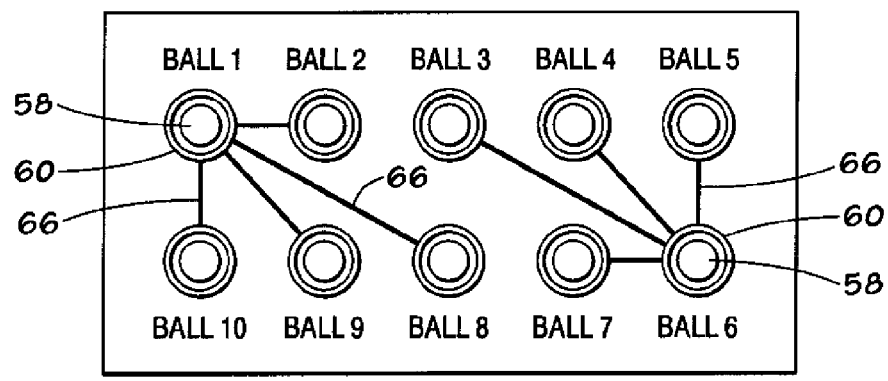
FIG. 9 is an alternative configuration for the interconnections between the connection pads of FIG. 8.
Figure 10:
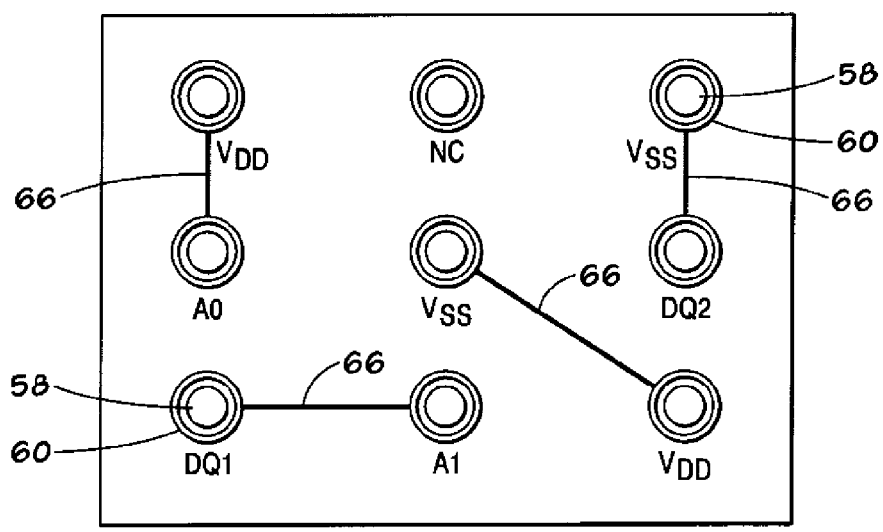
FIG. 10 illustrates exemplary interconnections between various connection pads, including power connection pads and ground connection pads, that enable continuity testing between connection pads in accordance with one embodiment of the present invention.

Various connection pads of the memory device 38 or printed circuit board 52 may be electrically connected to each other, as illustrated in FIGS. 8-10. It should be noted that, while the present embodiment includes upper connection pads 48 having inner and outer conductive pads 58 and 60, other embodiments may instead or additionally include lower connection pads 46 on either one or more substrates 40 or the PCB 52 that include multi-stage conductive pads, such as primary conductive pads 58 and target or secondary connection pads 60. It will be appreciated that, although a finite number of connection pads are illustrated in FIGS. 8-10, embodiments of the present techniques may include pluralities of connection pads having any number of multiple members.

In the embodiment illustrated in FIG. 8, the connection pads for Balls 1-10 are connected in pairs via test paths 66. As generally discussed below, the test paths 66 are configured to be selectively interrupted such that a current carrying path may be established between two connection pads during a testing phase, and then interrupted upon completion of such testing to avoid interfering with normal operation of the device. The test paths 66 may be internal or external to a substrate 40 or the PCB 52. Once the assembly is properly heated to secure the memory device 38 to the PCB 52, each of the solder balls 50 electrically couples the respective inner and outer conductive pads 58 and 60 to one another. Further, a test path 66 connects each connection pad with at least one other connection pad.

With such a predefined electrical pathway between two solder balls and conductive pads, a continuity test may be performed between the two nodes, such as between the conductive pads corresponding to Ball 1 and Ball 2, to verify that the solder balls 50 are properly connected to both the substrate 40 and the PCB 52. Such testing may be performed by a bed-of-nails testing apparatus or in some other fashion. As will be appreciated, if each of Balls 1 and 2 are properly connected between the upper and lower connection pads, the resistance between these two balls would be substantially zero ohms. Conversely, if one or both of these balls has not been properly connected between upper and lower connection pads, the continuity test would reveal a substantially high resistance between these two balls, which is indicative of an open circuit resulting from a connection failure at one or both of the solder balls. Additionally, although some embodiments may include multi-stage connection pads in which outer conductive pads of two connection pads may be electrically coupled, other embodiments may employ single-stage connection pads that are electrically connected to each other for such testing in full accordance with the present techniques.

While Balls 1-10 are interconnected in pairs in FIG. 8, other configurations and arrangements may be used in accordance with the present techniques, such as the configuration illustrated in FIG. 9. Particularly, one connection pad, such as that for Ball 1, may be independently connected to a plurality of other balls via test paths 66, such as to Balls 2, 8, 9, and 10. As noted above, a continuity test may be performed between each pair or combinations of interconnected connection pads and solder balls to determine whether there is an open solder joint or a proper solder connection of each ball of the tested pair.

It should also be noted that such continuity testing may be performed between a pair of connection pads irrespective of the intended function of the pads. Particularly, the above techniques may be used to test for open circuits at solder balls adjacent power connection pads, ground connection pads, or both. In order to avoid interference with the device during normal operation, the test paths 66 are configured to facilitate disabling of the test paths 66 once the device has been tested. As will be appreciated, various connection pads may be provided to fulfill specific functions. For instance, as illustrated in FIG. 10, various pads may include power connection pads Vdd, ground connection pads Vss, addressing pads A0 and A1, data connection pads DQ1 and DQ2, and unconnected pads NC, to name just a few. In a typical configuration, all of the power connection pads Vdd may be connected to an internal power plane and the ground connection pads Vss may be connected to an internal ground plane.

Through the presently disclosed techniques, however, the solder connections of solder balls 50 to these pads may be tested by providing a test path 66 between one of these connection pads and one other connection pad that serves a different function. For instance, a power supply connection pad may be coupled to an addressing connection pad, a ground connection pad may be coupled to a data connection pad, or a power connection pad may be coupled to a ground connection pad to facilitate continuity testing in accordance with the techniques described above. Through these techniques, the power and ground connection pads may be simply tested to verify proper connection of these pads to an opposing substrate.

While electrical test paths 66 are useful in testing the solder connections and detecting any open circuits, it will be appreciated that these test paths 66, if left operable, would interfere with operation of a memory device 38. Accordingly, the electrical connection between the various pads provided by electrical test paths 66 may be disabled or disconnected following the continuity tests. In some embodiments, the test paths 66 are configured to open upon application of power exceeding a certain threshold, operating similar to a fuse. Consequently, in these embodiments, once the memory device has been tested for proper connection with other circuitry, such as another memory device or the PCB 52, power may be applied to the test paths 66 to sever these connections between the connection pads. In other embodiments, the substrate 40 or PCB 52 having such test paths 66 may include a logic circuit that would operate to enable or disable test paths 66, such as through a mode register or in some other manner.

Although the target pads 60 may be used, as noted above, to test proper connection between the connections pads about a solder ball 50, they may also provide other functionality. For instance, target pads 60 could be electrically coupled to other circuitry and used to activate special functions of a memory device that are only enabled during a high temperature reflow of the solder balls 50. Further, such target pads could be used to detect heating that could damage parts of a device assembly. In such an embodiment, the size of the outer conductive path could be adjusted such that only a solder ball that exceeded a certain threshold temperature would make contact with this pad. Additionally, while some embodiments above have been described with multi-stage connection pad including a pair of connection pads, it should also be noted that additional pads may be utilized. For instance, in some embodiments, a third conductive pad may be disposed adjacent or about the other conductive pads to provide added functionality or detect excessive heating, as described above.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for efficiently testing interconnects of electronics comprising:
positioning a plurality of solder balls between a plurality of first connection pads on a first substrate and a plurality of second connection pads on a second substrate, wherein either the plurality of first connection pads or the plurality of second connection pads comprises a plurality of multi-stage connection pads each including an inner conductive pad and an outer conductive pad positioned concentrically about the inner conductive pad, such that the inner and outer conductive pads are electrically isolated from one another; and
heating the plurality of solder balls such that each respective one of the plurality of solder balls electrically couples a respective one of the plurality of first connections pads to a respective one of the second plurality of connection pads, and such that each respective one of the plurality of solder balls establishes an electrical connection between the inner and outer conductive pads of each of the plurality multi-stage connection pads.

2. The method of claim 1, wherein the inner conductive pad and the outer conductive pad of each of the plurality of multi-stage connection pads comprises a primary connection pad and a target connection pad, respectively.

3. The method of claim 2, wherein heating the plurality solder balls includes heating the plurality of solder balls such that each of the plurality solder balls establishes an electrical connection between a respective one of the primary connection pads and a respective one of the target connection pads.

4. The method of claim 1, wherein each of the plurality of multi-stage connection pads comprises at least two electrically isolated conductive regions, and wherein heating the plurality of solder balls forms an electrically conductive path between the at least two electrically isolated conductive regions.

5. The method of claim 1, wherein each of the plurality of first connection pads and each of the plurality of second connection pads comprises a plurality of multi-stage connection pads.

6. The method of claim 1, comprising electrically testing an outer stage of each of the plurality of multi-stage connection pads to verify electrical connection between the first substrate and the second substrate.

7. The method of claim 1, comprising electrically testing an outer stage of each of the plurality of multi-stage connection pads to identify excessive heating of each of the plurality of solder balls.

8. The method of claim 1, wherein heating the plurality of solder balls enables additional functionality of a memory device coupled to one of the first substrate or the second substrate.

9. The method of claim 1, wherein heating the plurality of solder balls electrically couples an outer stage of at least one of the plurality of multi-stage connection pads to additional circuitry on one of the first substrate or the second substrate.

10. The method of claim 1, wherein each of the plurality of multi-stage connection pads comprises three electrically isolated conductive regions.

11. The method of claim 1, wherein positioning comprises positioning the plurality of solder balls such that the plurality of solder balls are not in contact with the outer conductive pads before heating.

12. A method for efficiently testing interconnects of electronics comprising:
   positioning a solder ball between a first connection pad of a first substrate and a second connection pad of a second substrate, wherein at least one of the first connection pad or the second connection pad comprising a multi-stage connection pad having multiple conductive pads electrically isolated from one another, wherein each of the multiple conductive pads is disposed on a non-conductive surface of the first substrate or the second substrate; and
   heating the solder ball to adhere the first connection pad to the second connection pad, and wherein heating the solder ball deforms the solder ball to establish an electrical connection between the multiple conductive pads of the multi-stage connection pad.

13. The method of claim 12, wherein each multi-stage connection pad having multiple conductive pads comprises an inner conductive pad completely surrounded by an outer conductive pad that is electrically isolated from the inner conductive pad.

14. The method of claim 12, wherein positioning comprises positioning the solder ball on the multi-stage pad such that the solder ball is only in contact with one of the multiple conductive pads before heating.

15. The method of claim 12, comprising identifying excessive heating of the solder ball by detecting that the solder ball has deformed such that an electrical connection has been established between the multiple conductive pads of the multi-stage connection pad.

16. The method of claim 12, wherein the multi-stage connection pad comprises an inner conductive pad and an outer conductive pad surrounding the inner conductive pad, wherein heating the solder ball deforms the solder ball to establish an electrical connection between the inner conductive pad and the outer conductive pad.

17. The method of claim 16, comprising testing the outer conductive pad to determine whether an electrically conductive path is established between the first substrate and the second substrate, after heating the solder ball.

18. The method of claim 12, wherein heating the solder ball to establish electrical connection between the multiple conductive pads enables additional functionality through an electrical path connecting circuitry to an outer stage of the multi-stage connection pad.

19. The method of claim 18, wherein heating the solder ball to establish electrical connection between the multiple conductive pads enables additional functionality through an electrical path connecting a memory device to an outer stage of the multi-stage connection pad.

* * * * *